(12) United States Patent
Suthar et al.

(10) Patent No.: US 6,838,294 B2
(45) Date of Patent: Jan. 4, 2005

(54) FOCUSED ION BEAM VISUAL ENDPOINTING

(75) Inventors: Sailesh C. Suthar, Portland, OR (US); Paul J. Hack, Portland, OR (US); Syed Nabeel Sarwar, Hillsboro, OR (US); Mary J. Martinez, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 10/076,130

(22) Filed: Feb. 13, 2002

(65) Prior Publication Data

US 2003/0153192 A1 Aug. 14, 2003

(51) Int. Cl.[7] ................................................. H01L 21/00
(52) U.S. Cl. ............................. 438/9; 438/14; 438/712; 438/719
(58) Field of Search ............................... 438/4, 5, 9, 10, 438/14, 710, 712, 714, 719, 720

(56) References Cited

U.S. PATENT DOCUMENTS

| | | | | |
|---|---|---|---|---|
| 3,997,381 A | * | 12/1976 | Wanlass | 438/10 |
| 5,086,011 A | * | 2/1992 | Shiota | 438/406 |
| 5,821,549 A | * | 10/1998 | Talbot et al. | 250/307 |
| 6,093,331 A | * | 7/2000 | Wollesen | 216/2 |
| 6,168,960 B1 | * | 1/2001 | Li | 438/14 |
| 6,210,981 B1 | * | 4/2001 | Birdsley et al. | 438/9 |
| 6,281,025 B1 | * | 8/2001 | Ring et al. | 438/10 |
| 6,303,396 B1 | * | 10/2001 | Ring et al. | 438/14 |
| 6,355,564 B1 | * | 3/2002 | Birdsley et al. | 438/689 |
| 2002/0155645 A1 | * | 10/2002 | Stevens | 438/149 |

* cited by examiner

Primary Examiner—Duy-Vu Deo
(74) Attorney, Agent, or Firm—Fish & Richardson P.C.

(57) ABSTRACT

A method for use in removing a portion of a semiconductor chip. The method comprises etching a backside of the semiconductor chip, the frontside including a first well with a first type of doping and a second well with a second type of doping; monitoring a backside of the semiconductor chip during etching; and determining when a first portion of the backside over one of the first and second wells differs from a second portion of the backside over the other of the first and second wells. A method for etch endpoint detection includes etching a backside of a semiconductor chip, the semiconductor chip having at least one doped well formed proximate a frontside of the semiconductor chip; monitoring the backside of the semiconductor chip during etching until at least one doped well becomes visible; and stopping etching after the doped well becoming visible.

24 Claims, 2 Drawing Sheets

FOCUSED ION BEAM VISUAL ENDPOINTING

TECHNICAL FIELD

The application relates, generally, to integrated circuit processing and, more particularly, to endpoint detection for ion beam etching.

BACKGROUND

During product development of integrated circuits, prototype circuits can be physically edited to debug an integrated circuit design. Circuit editing involves an alteration of interconnect routing by, e.g., drilling vias through a backside of a chip to interconnections in the chip and depositing metal in the vias to alter the connections between device active areas. Devices on a chip can thereby be connected in alternative ways, facilitating post-processing troubleshooting.

Prior to the formation of this type of via, the backside of a silicon chip is thinned by, e.g., focused ion beam etching, also known as ion milling. Typically, a timed etch is performed based on the expected etch rate and the expected silicon thickness. A timed etch can be problematic, especially in the case of variable etch rates and silicon thicknesses. The thickness of silicon remaining after a timed etch typically falls within a wide range such as 4–5 microns ($\mu$m)±2 $\mu$m, leading to unreliability in subsequent processing, such as via formation. Further, thinning the chip too much can damage the device which one wishes to contact. For example, etching into a diffused region can adversely affect device performance.

An alternative to timed etching includes photo current endpoint/real time optical beam induced current (PCEP/RT-OBIC) technique. This technique has the drawback of requiring the installation of additional hardware. A further limitation of the PCEP/RT-OBIC technique is that it does not provide an endpoint curve if the area being milled has >30% decoupling capacitors, i.e. capacitors for noise filtering, or if the mill box size, i.e. the area scanned by an ion beam during etching, is less than 100 $\mu$m×100 $\mu$m.

DESCRIPTION

An endpointing method enables one to consistently stop etching a backside of a silicon chip within a distance of approximately 2 $\mu$m from a bottom portion of a diffused region. A focused ion beam induces a charge in a p-well proximate an n-well when the beam etching the backside of the chip comes within 2 $\mu$m of the diffused regions. The etching can be stopped at that point. Subsequently, vias can be formed to contact interconnects in the chip.

Figure 1:
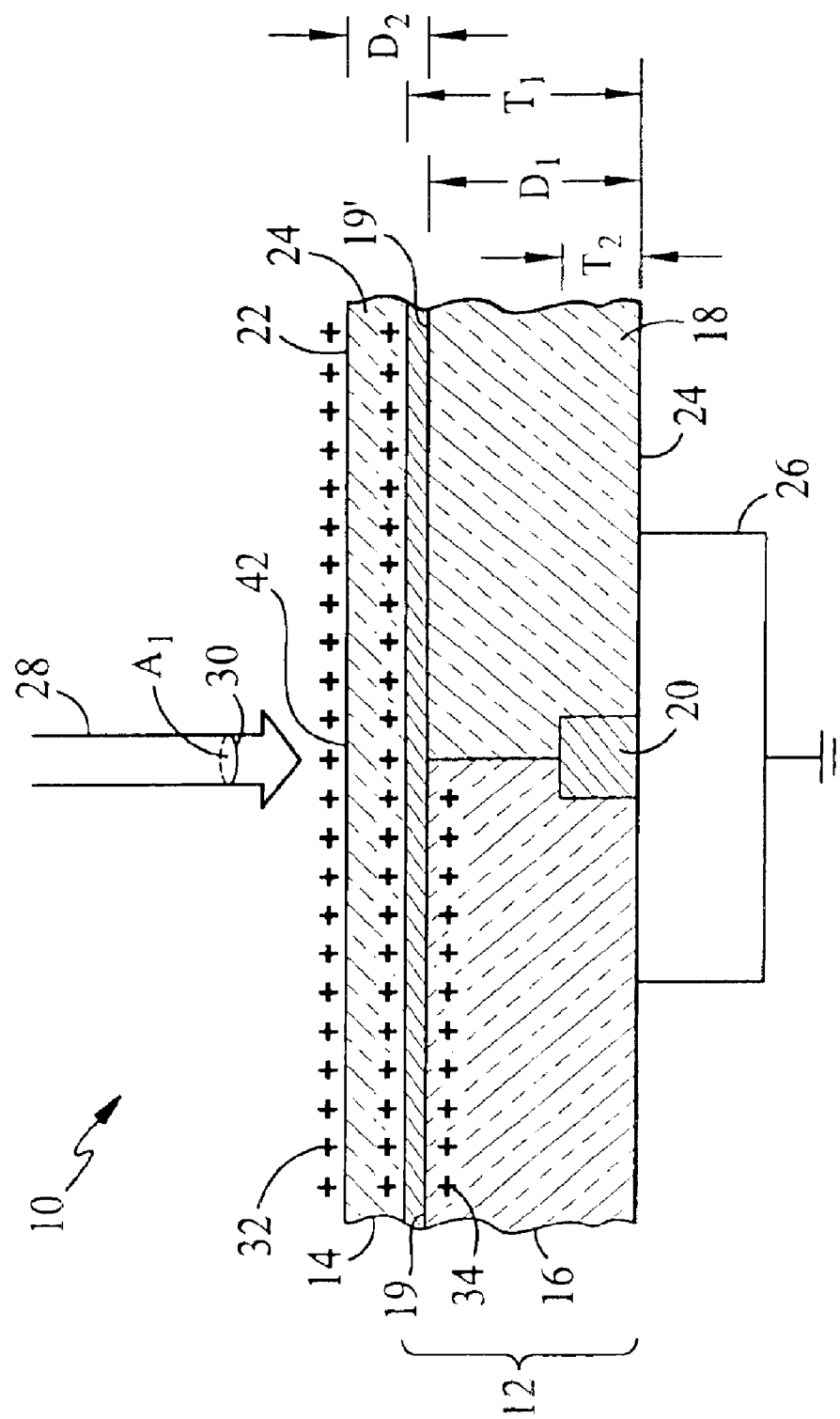
FIG. 1 is a cross-sectional view of a silicon substrate being milled from its backside, according to an embodiment.

Referring to FIG. 1, a semiconductor chip 10 (shown upside down with a backside 22 facing upward) has an epitaxial layer 12 formed over a silicon substrate 14. Semiconductor chip 10 is packaged such that backside 22 of silicon substrate 14 is exposed. Suitable packaging (not shown) is a control collapsed chip carrier (C4). Epitaxial layer 12 has, e.g., p-type doping and a thickness $T_1$ of 2.75 $\mu$m. In some embodiments, T, is selected from a range of 2 $\mu$m–3 $\mu$m. An n-well 16 and a p-well 18 (see also FIG. 2) are formed in epitaxial layer 12 by, for example, the implantation of n-type ions and p-type ions, respectively. Bottom portions of n-well 16 and p-well 18 form an n-well junction 19 and a p-well junction 19' in epitaxial layer 12, respectively. Typically, junctions 19, 19' have a depth $D_1$ equal to approximately 80–90% of the thickness T, of epitaxial layer 12. N-well 16 and p-well 18 have, for example, junction 19, 19' depths $D_1$ of approximately 2.4 $\mu$m.

A shallow trench isolation (STI) region 20 is formed between n-well 16 and p-well 18. STI region 20 includes a dielectric such as silicon dioxide that provides electrical isolation between portions of n-well 16 and p-well 18 proximate to STI region 20. A thickness $T_2$ of STI region 20 is approximately one-third of the thickness T, of epitaxial layer 16. Thickness $T_2$ of STI region 20 is, for example, 0.9 $\mu$m.

Backside 22 of silicon substrate 14 has been globally thinned from an initial thickness of about 775 $\mu$m to about 100 $\mu$m. This global thinning can be done in a polishing/grinding system. Subsequently, a localized area 24 over n-well region 16 and p-well region 18 was thinned to leave a thickness of about 10 $\mu$m–15 $\mu$m of silicon substrate 14/epitaxial layer 12 above junctions 19, 19'. Localized thinning can be done in a laser-chemical etching system.

Subsequent to localized backside thinning, semiconductor chip 10 is loaded into a focused ion beam (FIB) system (not shown) for backside etching. Focused ion beam system is, for example, a Vectra™ 986 system manufactured by FEI Company of Hillsboro, Oreg. Upon being loaded into the FIB system, a front side 24 of semiconductor chip 10 is coupled to FIB system's connection 26 to ground potential.

A gallium ion beam 28 further etches backside 22 of silicon substrate 14 over n-well 16 and p-well 18, i.e. gallium ion beam 28 etches back localized thinned area 24. Gallium ion beam 28 has a relatively high current ranging from, e.g., 8 nanoamperes to 19 nanoamperes. Spot size 30 has an area $A_1$. In the case where gallium ion beam 28 current is 19 nanoamperes, Al is approximately 1–2 square microns ($\mu$m$^2$). A xenon difluoride (XeF$_2$) gas flux is used in conjunction with gallium ion beam 28. XeF$_2$ is introduced at a flow rate sufficient to cause a pressure loss in an etch chamber (not shown) equivalent to approximately 1–2 Torr. XeF$_2$ accelerates etching of backside 22 by providing fluorine ions to react with silicon substrate 14. If gallium ion beam 28 current is 19 nanoamperes, an etch rate of silicon substrate 14 is 1.0×10E5 to 1.8×10E5 cubic micrometers/minute ($\mu$m$^3$/min).

Localized thinned area 24 is etched back by gallium ion beam 28 until silicon substrate backside 22 is within a distance $D_2$ from junctions 19, 19'. $D_2$ is, for example, 2 $\mu$m. In some embodiments, $D_2$ is approximately 1.5 to 3 $\mu$m.

The moment that distance $D_2$ from junctions 19, 19' is reached is determined as follows. During focused ion beam etching, gallium ion beam 28 induces a positive charge 32 in silicon substrate 14. This positive charge 32 is induced by positively charged ions comprising gallium ion 10 beam 28. N-well 16 in epitaxial layer 12 has a relatively high resistivity of approximately 1000 ohms-cm and is capacitively coupled to a source voltage ($V_{ss}$) (not shown). The resistivity and capacitive coupling of n-well 16 reduces the possibility of an ion discharge of a positive charge 34 built-up in epitaxial layer 12 and positive charge 32 built up in silicon substrate 14 over n-well 16, thereby creating a brighter region in an image 40 on a monitor (see discussion below with reference to FIG. 2). On the other hand, p-well 18 has a lower resistivity than n-well 16, e.g., approximately 500 ohm-cm. This lower resistivity allows positive charges 32 induced over p-well 18 to dissipate relatively quickly, thereby creating a darker region in image 40 on the monitor (see discussion below with reference to FIG. 2).

Figure 2:
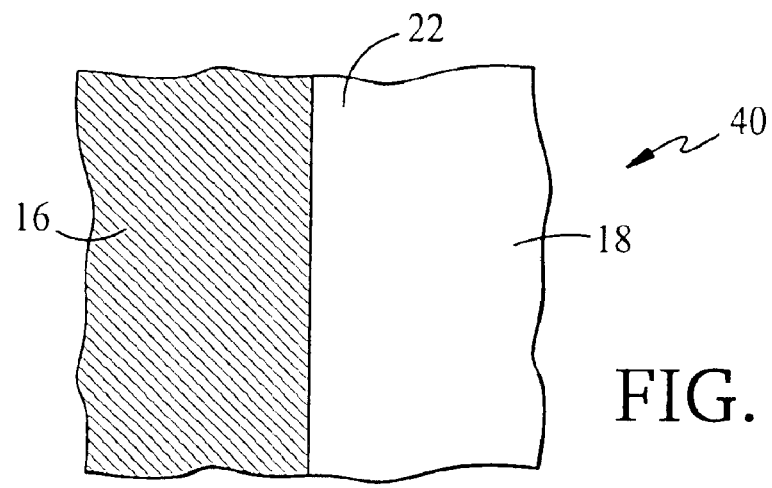
FIG. 2 is a top view of the backside of the silicon substrate of FIG. 1.

Referring also to FIG. 2, during the etching of silicon substrate 14, image 40 of backside 22 is transmitted to the monitor. Image 40 on the monitor corresponds to a portion 42 of backside 22 upon which gallium ion beam 28 impinges. Image 40 is formed by the detection of secondary electron emission from silicon substrate 14 induced by gallium ion beam 28. The positive charge 34 build-up over n-well 16 reduces secondary electron emission over n-well 16. The discharge of positive charge 32 over p-well 18, however, increases secondary electron emission over p-well 18.

As gallium ion beam 28 induces etching of silicon substrate 14 and gallium ion beam 28 approaches within distance $D_2$ of approximately 2 μm from junctions 19, 19' by thinning silicon substrate 14, the difference between secondary electron emission over n-well 16 and p-well 18 becomes visible. The low secondary electron emission over n-well 16 appears as a dark area in image 40, while the higher secondary electron emission over p-well 18 appears as a bright area, in contrast to n-well 16. To show the required contrast between n-well 16 and p-well 18, the monitor is calibrated with 256 gray levels.

A person or computer operating the focused ion beam system, upon determining the presence of contrast in brightness between n-well 16 and p-well 18, stops the focused ion beam etching by turning off gallium ion beam 28. This contrast becomes visible only when a distance $D_2$ is approximately 2 μm or less, i.e. when ≤2 μm of silicon is left above junctions 19, 19' of n-well 16 and p-well 18, respectively. By stopping the focused ion beam etching at the point when the contrast first appears, one can consistently thin backside 22 of semiconductor chip 10 to a thickness $D_2$ of approximately 2 μm over n-well 16 and p-well 18.

After the completion of the thinning of silicon substrate 14 by focused ion beam etching, a circuit on semiconductor chip 10 is edited, i.e. electronic routing is physically altered. A via (not shown) is formed through a remaining portion of silicon substrate 14 and epitaxial layer 12 in an inactive area to contact an interconnect (not shown). Vias are filled with metal plugs (not shown), and interconnections (not shown) are formed between metal plugs to modify electronic routing between devices on semiconductor chip 10. The same focused ion beam system which is used for focused ion beam etching can be used to form these vias, metal plugs, and interconnections.

Figure 3:
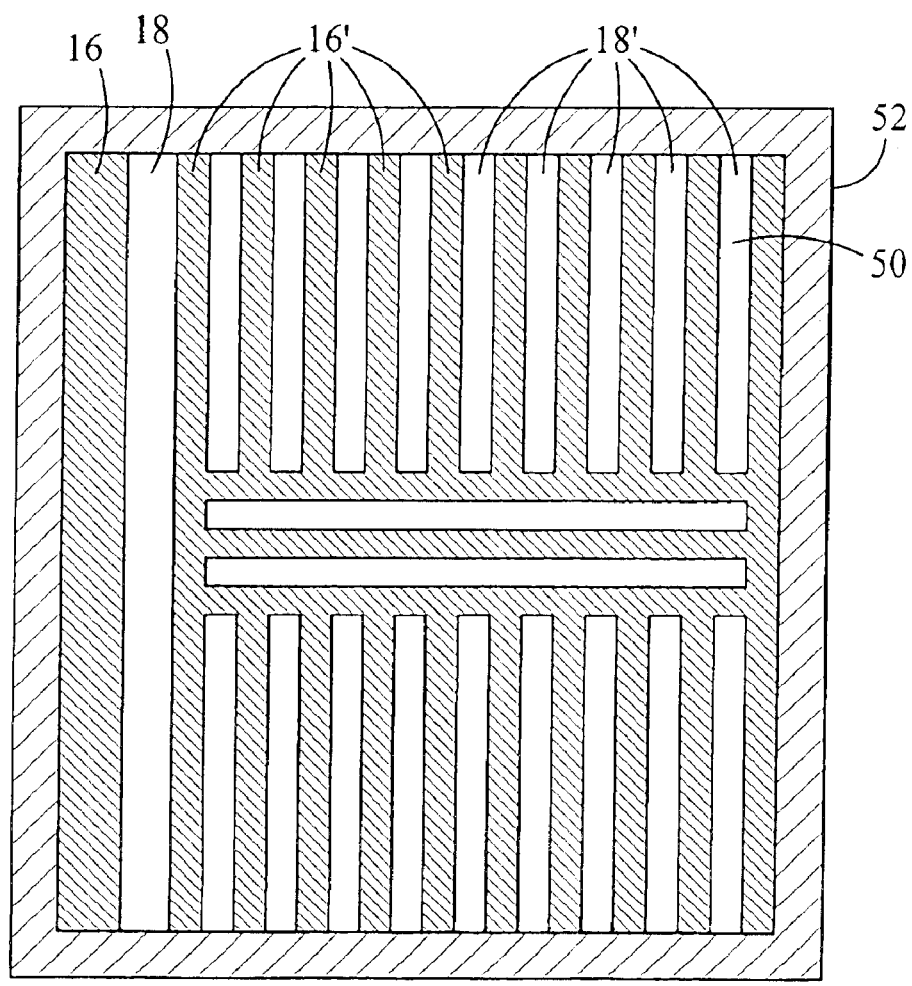
FIG. 3 is a top view of a backside of a silicon substrate, as displayed in a monitor.

Referring also to FIG. 3, an image 50 appears on a monitor 52 when gallium ion beam 28 impinges on semiconductor chip 10 (see FIG. 1). Image 50 includes an entire area of semiconductor chip 10 backside 22 which is contacted by gallium ion beam 28. As noted above with reference to FIG. 1, gallium ion beam 28 has a relatively high beam current of 8 nanoamperes—19 nanoamperes with a correspondingly relatively large spot size 30 with area Al of, for example, 1–2 μm$^2$. Further, gallium ion beam 28 is scanned back and forth across a portion of backside 22, covering an area having a mill box size of, for example, 250 μm×250 μm. Gallium ion beam 28 impinges, therefore, simultaneously on a number of n-wells 16, 16', and p-wells 18, 18'. For the reasons described above with reference to FIGS. 1 and 2, n-wells 16, 16' appear on monitor 52 as dark areas and p-wells 18, 18' appear on monitor 52 as bright areas, after the silicon above the junctions 19, 19' of n-wells 16, 16' and p-wells 18, 18' is thinned to approximately 2 μm. Once this point is reached, focused ion beam etching can be stopped and connections between transistors (not shown) within n-wells 16, 16' and p-wells 18, 18' can be modified by well-known circuit editing procedures, as mentioned above with reference to FIG. 2.

The method is not limited to the specific embodiments described above. For example, other focused ion beam systems can be used, manufactured by companies such as Hitachi, Schlumberger, etc. The described method can be used as an endpoint detection method for etching any substrate that has two regions with two types of doping, including an n- or a p-well combined with an intrinsic semiconductor such as undoped silicon. The semiconductor chip can be etched with a material other than gallium ions, such as another type of ion beam or an electron beam. In the case of etching with a negatively charged beam, the n-wells will appear brighter than the p-wells.

Embodiments of the described endpoint detection method can find applicability in various computing and processing environment. An embodiment of the endpoint detection method may be implemented in computer programs executing on programmable computers or other machines that each include a processor, a storage medium readable by the processor (including volatile and non-volatile memory and/or storage components), at least one input device, and one or more output devices. Program code may be applied to data entered using an input device (e.g., a mouse or keyboard) to perform embodiments of the endpoint detection method and to generate output information. Each such program may be implemented in a high level procedural or object-oriented programming language to communicate with a computer system. However, the programs can be implemented in assembly or machine language. The language may be a compiled or an interpreted language.

Each computer program may be stored on a storage medium/article (e.g., CD-ROM, hard disk, or magnetic diskette) that is readable by a general or special purpose programmable computer for configuring and operating the computer when the storage medium or device is read by the computer to perform embodiments of the endpoint detection method. An embodiment of the endpoint detection method may also be implemented as a machine-readable storage medium, configured with a computer program, where, upon execution, instructions in the computer program cause a machine to operate in accordance with an embodiment of the endpoint detection method.

A computer can be programmed to etch semiconductor chip 10, monitor the backside of semiconductor chip 10 during etching, determine when a first portion of the backside over one of first and second wells in the frontside of chip 10 differs from a second portion of the backside over the other of the first and second wells.

The semiconductor chip 10 may be formed on a substrate formed from a material other than silicon, such as gallium arsenide or another material. Instead of a completed semiconductor chip 10, the endpoint detection method can be used with any semiconductor substrate having a first region with a first type of doping and a second region with a second type of doping. The first or the second region can be an undoped intrinsic semiconductor region.

Other embodiments not described herein are also within the scope of the following claims.

What is claimed is:

1. A method for use in removing a portion of a semiconductor chip having a frontside and a backside, the method comprising:

etching the backside of the semiconductor chip, the frontside including a first well with a first type of doping and a second well with a second type of doping;

monitoring the backside of the semiconductor chip during etching; and determining when a first portion of the backside over one of the first and second wells differs from a second portion of the backside over the other of the first and second wells.

2. The method of claim 1, wherein the first portion of the backside differs from the second portion of the backside by the first portion having a first brightness that contrasts with a second brightness of the second portion.

3. The method of claim 2, further comprising:

stopping etching after determining that the first portion of the backside differs from the second portion.

4. The method of claim 3 wherein stopping etching comprises leaving a portion of the substrate.

5. The method of claim 4 wherein stopping etching comprises leaving a backside portion of the substrate having a thickness of approximately 1.5 microns to approximately 3.0 microns.

6. The method of claim 1, wherein etching comprises etching the backside of a silicon substrate.

7. The method of claim 6, wherein the silicon substrate comprises a first well with n-type doping and a second well with p-type doping.

8. The method of claim 6, wherein the silicon substrate comprises a first well with n-type doping and a second well with intrinsic silicon.

9. The method of claim 6, wherein the silicon substrate comprises a first well with p-type doping and a second well with intrinsic silicon.

10. The method of claim 1, wherein monitoring the backside comprises visually monitoring the backside.

11. A method for detecting an endpoint of an etch, the method comprising:

etching a backside of a semiconductor chip with a focused ion beam, the semiconductor chip having a frontside including an n-well and a p-well proximate the n-well, the n-well defining an n-well junction and the p-well defining a p-well junction;

observing the backside of the semiconductor chip during etching; and determining when a portion of the backside over the n-well differs from a portion of the backside over the p-well.

12. The method of claim 11, wherein a first portion of the backside differs from a second portion of the backside by the first portion having a first brightness that contrasts with a second brightness of the second portion.

13. The method of claim 11, wherein the focused ion beam comprises a gallium focused ion beam.

14. The method of claim 13 wherein the gallium focused ion beam has a beam current of greater than approximately 8 nanoamperes.

15. The method of claim 11, wherein etching is performed using a xenon difluoride gas flux.

16. The method of claim 11, wherein etching comprises coupling the semiconductor chip to ground potential.

17. A method for etch endpoint detection, the method comprising:

etching a backside of a semiconductor chip, the semiconductor chip having at least one doped well formed proximate a frontside of the semiconductor chip;

monitoring the backside of the semiconductor chip during etching until a portion of the backside over at least one doped well differs from a portion of the backside that is not over the at least one doped well; and stopping etching after the doped well becoming visible.

18. The method of claim 17, wherein etching comprises coupling the semiconductor chip to ground potential.

19. The method of claim 17, wherein etching is performed using a focused ion beam.

20. The method of claim 19, wherein the focused ion beam comprises a gallium focused ion beam.

21. The method of claim 17, wherein etching is performed with a xenon difluoride flux.

22. A method for detecting an endpoint of an etch, the method comprising:

etching a backside of a semiconductor chip with a negatively charged beam, the semiconductor chip having a frontside including an n-well and a p-well proximate the n-well, the n-well defining an n-well junction and the p-well defining a p-well junction;

monitoring the backside of the semiconductor chip during etching; and determining when a first portion of the backside over the n-well differs from a second portion of the backside over the p-well.

23. The method of claim 22, the first portion of the backside differs from the second portion by appearing bright in contrast to the second portion.

24. The method of claim 22, wherein the beam comprises an electron beam.

* * * * *